(12) United States Patent
Goux (10) Patent No.: US 9,059,390 B2
(45) Date of Patent: Jun. 16, 2015

(54) SELF-ISOLATED CONDUCTIVE BRIDGE MEMORY DEVICE

(71) Applicant: IMEC, Leuven (BE)

(72) Inventor: Ludovic Goux, Hannut (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/760,480

(22) Filed: Feb. 6, 2013

(65) Prior Publication Data

US 2013/0200320 A1 Aug. 8, 2013

Related U.S. Application Data

(60) Provisional application No. 61/595,458, filed on Feb. 6, 2012.

(51) Int. Cl.
*H01L 47/00* (2006.01)
*H01L 45/00* (2006.01)

(52) U.S. Cl.
CPC ............ *H01L 45/04* (2013.01); *H01L 45/085* (2013.01); *H01L 45/1233* (2013.01); *H01L 45/1266* (2013.01); *H01L 45/145* (2013.01); *H01L 45/146* (2013.01)

(58) Field of Classification Search
CPC ............ H01L 2224/48091; H01L 2924/0002; H01L 2924/00; H01L 2924/00014; H01L 21/76802; H01L 27/2436; H01L 29/785; H01L 33/20; H01L 35/32; H01L 45/06; H01L 21/0337; H01L 21/50; H01L 21/768
USPC ............ 257/1–5, E45.002, E45.001; 438/99, 438/102, 104, 197, 253, 382, 386–387
See application file for complete search history.

(56) References Cited

U.S. PATENT DOCUMENTS

2011/0121254 A1 * 5/2011 Dressler et al. ............... 257/4

OTHER PUBLICATIONS

Waser, Rainer et al., "Redox-Based Resistive Switching Memories—Nanoionic Mechanisms, Prospects, and Challenges", Advanced Materials, vol. 21, 2009, pp. 2632-2663.

* cited by examiner

*Primary Examiner* — Mark A Laurenzi
(74) *Attorney, Agent, or Firm* — McDonnell Boehnen Hulbert & Berghoff LLP (57) ABSTRACT

A conductive-bridge random access memory device is disclosed comprising a second metal layer configured to provide second metal cations; a layer of insulator adjacent to the second metal layer; the layer of insulator comprising a layer of first insulator and a layer of second insulator; the layer of second insulator being adjacent to the second metal layer; a first metal layer adjacent to the layer of first insulator, the first metal layer being opposite to the second metal layer; wherein the density of the layer of second insulator is higher than the density of the layer of first insulator.

19 Claims, 8 Drawing Sheets

Figure 8

SELF-ISOLATED CONDUCTIVE BRIDGE MEMORY DEVICE

CROSS REFERENCE TO RELATED APPLICATIONS

Pursuant to the provisions of 35 U.S.C. §119(e), this application claims priority to U.S. Provisional Patent Application Ser. No. 61/595,458, which was filed Feb. 6, 2012, the entire contents of which are incorporated herein by reference.

FIELD OF THE DISCLOSURE

The present disclosure is related to Conductive Bridge Random Access Memory devices, known as CBRAM devices.

DESCRIPTION OF THE RELATED TECHNOLOGY

Figure 1:
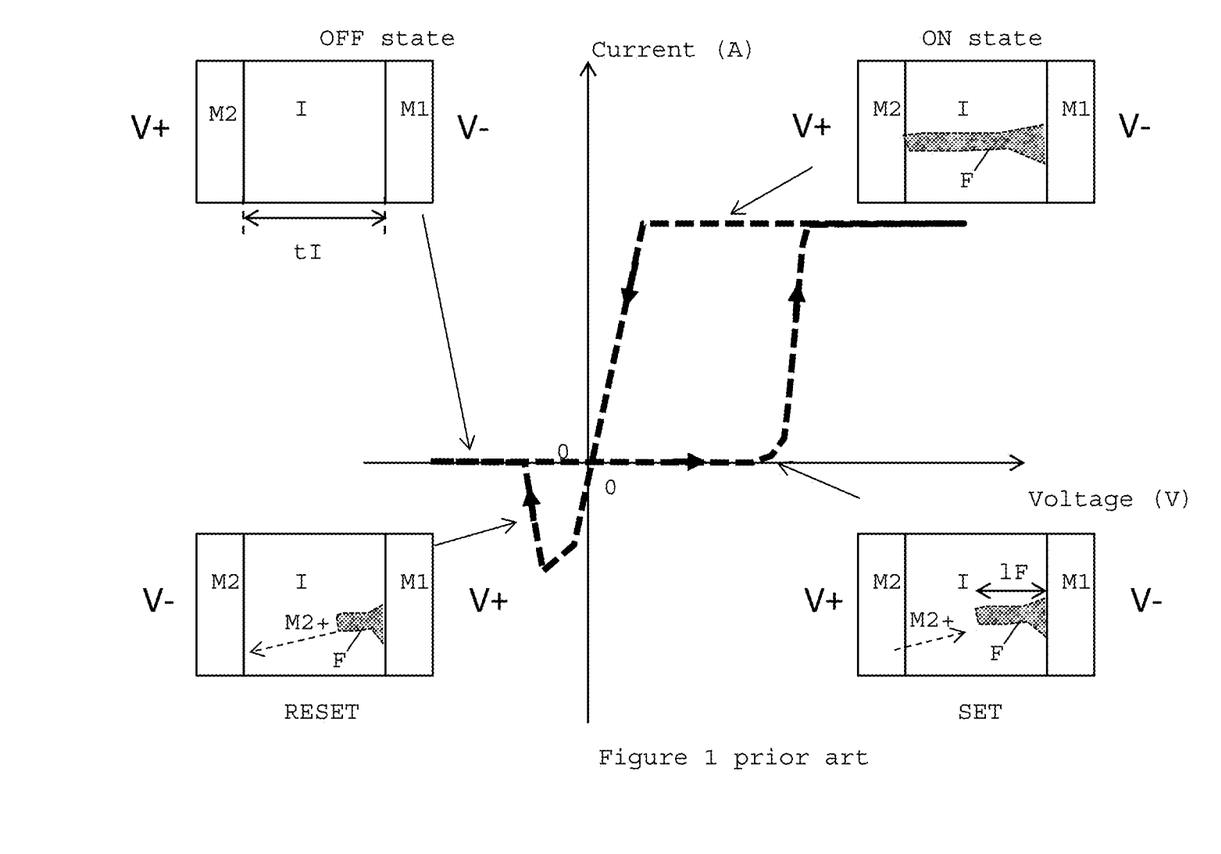
FIG. 1 illustrates the operation of a prior art CBRAM memory cell.

A Conductive Bridge RAM memory device, also known as CBRAM memory, is a particular type of resistive switching RAM memory device, known as RRAM memory. A CBRAM memory device comprises a memory cell containing a stack of a layer of a second metal (M2), a layer of an insulator (I) having a thickness and a layer of a first metal (M1), the layer of insulator (I) being sandwiched in between the first metal layer (M1) and the second metal layer (M2). In such a Metal-Insulator-Metal (MIM) stack, the layer of insulating material is thus sandwiched between two opposing layers of metal M1 and M2 as shown in FIG. 1.

CBRAM is based on electrochemical formation/disruption of a metal, mostly Cu or Ag, nanofilament through the layer of the insulating material, whereby this nanofilament formation is induced by electrical pulses. Waser et al. describe in "Redox-based resistive switching memories—nanoionic mechanisms, prospects, and challenges"; Advanced Materials 2009, 21, p 2632-2663 this nanofilament formation. Either the first metal (M1) or the second metal (M2) provides cations, usually Cu or Ag cations, for the voltage-controlled growth of this metallic filament, also often referred to as nanofilament, through the insulator layer. This nanofilament formation process allows switching the cell to a lower electrical resistance bringing the cell in the ON state. By applying a voltage of opposing polarity, nanofilament can be dissolved. Hence the memory cell can reversibly return to a higher electrical resistance state being the OFF state.

Due to scaling potential and fast switching speed, CBRAM is considered as a serious candidate for future memory replacement.

BRIEF DESCRIPTION OF THE DRAWINGS

All drawings are intended to illustrate some aspects and embodiments of the present disclosure. The drawings described are only schematic and are non-limiting.

FIGS. 4a-c shows for a CBRAM memory cell according to certain embodiments of this disclosure (a) a set of current-voltage characteristics after a SET/RESET cycle for a $HfO_2$ insulator layer (I) showing incomplete filament formation for 3 samples (I), (b) effectiveness of metallic filament formation for insulator materials with different layer densities, (c) a schematic illustrating the impeded metallic filament formation.

SUMMARY

In a first aspect of the disclosure, a CBRAM memory cell is disclosed, comprising a second metal layer configured to provide second metal cations, a layer of insulator adjacent to this second metal layer and a first metal layer at the side of the insulator layer opposite the second metal layer, wherein the insulator is selected to impede the growth of a filament of the second metal during operation.

In some embodiments, the layer of insulator comprises a layer of a first insulator adjacent to the first metal and a layer of a second insulator adjacent to the second metal, whereby the layer density of the second insulator is higher than the layer density of the first insulator, such that the filament growth speed is lower in the layer of the second insulator than in the layer of the first insulator.

In some embodiments the layer of insulator consist of a layer of a first insulator adjacent to the first metal and a layer of a second insulator adjacent to the second metal, whereby the layer density of the second insulator is higher than the layer density of the first insulator.

The layer of first insulator may consist of the same insulating material as the layer of second insulator. Although, the same insulating material, the layer density of the second insulator must be higher than the layer density of the first insulator.

The layer density of the second insulator is 85% or more of the bulk density of the second insulator and the layer density of the first insulator is less than 85% of the bulk density of the first insulator.

With bulk density is meant is the density of the material in its densest crystalline structure, and fabricated as a large volume sample (ceramic, ingot, ... ) as opposed to thin layers.

According to certain embodiments, a buffer layer may be present in between the second metal layer and the layer of second insulator.

According to certain embodiments, the layer of insulator has a thickness tI, the layer of first insulator has a thickness tI1 and the layer of second insulator has a thickness tI2, wherein the thickness of the layer of second insulator tI2 is between 1 and 20 nm. The thickness of the first insulator layer tI1 is substantially equal to the length of the metallic filament during filament growth. The thickness tI of the layer of insulator may be equal to or higher than the sum of the layer of first insulator thickness tI1 and the layer of second insulator thickness tI2.

In one embodiment, the second insulator is a thermally grown silicon-oxide.

In a second aspect, a method is disclosed for manufacturing a CBRAM memory cell comprising forming a first metal layer, forming a layer of first insulator on the first metal layer, forming a layer of second insulator on the layer of first insulator, forming a second metal on the layer of second insulator. The second metal layer being a source of second metal cations during operation of the CBRAM memory cell. The second insulator layer is selected to impede the growth of a filament of the second metal.

According to different embodiments, the layer density of the second insulator is higher than the layer density of the first insulator, such that the filament growth speed is lower in the layer of the second insulator than in the layer of the first insulator.

According to different embodiments, the layer density of the second insulator is 85% or more of the bulk density of the second insulator and the layer density of the first insulator is less than 85% of the bulk density of the first insulator.

According to different embodiments, the diffusivity of the layer of second insulator is higher than the diffusivity of the first insulator. The diffusivity of the layer of second insulator is preferably lower than 5e-6 cm$^2$/s. The diffusivity of the layer of first insulator is preferably higher than 5e-6 cm$^2$/s.

In another embodiment, the second insulator is a thermally grown silicon-oxide.

In a third aspect, a CBRAM memory array is disclosed comprising a CBRAM memory element according to the first aspect.

It is an advantage of the different aspects that a higher density and less complex configuration may be achieved for a CBRAM memory device due to the fact that the MIM stack comprises both the memory element as well as the selector element of the memory device. The selector element is integral to the MIM stack in the memory cell. Scaling is thus much easier using CBRAM memory cell according to embodiments of the present disclosure.

It is an advantage that a CBRAM memory device according to embodiments of the present disclosure allows bipolar operation, thereby offering a large memory window.

It is an advantage that leakage currents are reduced in a cross-bar array configuration comprising CBRAM memory devices according to different embodiments of the present disclosure.

It is an advantage of different aspects that the partial filament growth in the CBRAM memory device may be well controlled.

DETAILED DESCRIPTION

The disclosure will be further elucidated by means of the following description and the appended figures.

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The term "comprising" used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

The disclosure relates to a conductive bridge random access memory device (CBRAM).

Figure 3:
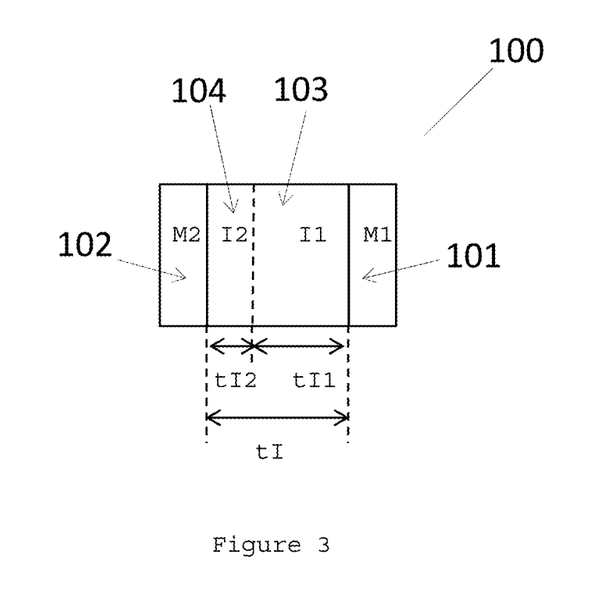
FIG. 3 shows a schematic cross-section of a CBRAM memory cell according to this disclosure.

FIG. 3 shows a schematic representation of a conductive bridge random access memory device (CBRAM) 100 according to an embodiment of the present disclosure. The conductive bridge random access memory device (CBRAM) 100 according to an embodiment of the present disclosure comprises a second metal layer 102 configured to provide second metal cations, a layer of second insulator 104 adjacent to the second metal layer 102, a layer of first insulator 103 adjacent to the layer of second insulator 104 and a first metal layer 101 adjacent to the layer of first insulator 103, whereby the layer density of the second insulator 104 is higher than the layer density of the first insulator 103, such that during filament growth the filament growth speed is lower in the layer of the second insulator 104 than in the layer of the first insulator 103.

The MIM stack of the memory cell is thus modified to contain a layer of insulating material (I1) which impedes the further growth of the filament (F) during the SET step. Hence, the selector element is integral to the MIM stack of the memory cell.

The CBRAM memory cell according to embodiments of the present disclosure will now be described in more detail.

One of the two metal layers (M1, M2) act as a source of metal cations, typically Cu or Ag, during the operation of the CBRAM memory device when a first voltage (V+ V−) difference is applied over the two metal layers. This cation source layer then provides metal cations (M2+) for the voltage-controlled growth of a metallic filament (F), having a length $I_F$, from the opposite metal layer (M1) onwards through the insulator layer (I) having a thickness $t_I$, until reaching the metal layer (M2) providing the metal cations (M2+). This filament growth process of the SET step allows switching the electrical resistance of the memory cell to lower values thereby bringing the memory cell in the low electrical resistance ON state.

Optionally, a buffer layer can be present in between the metal cations providing layer (second metal layer M2) and the insulator layer. The buffer layer allows a controlled injection of metal cations into the insulator layer (I, I2). For example a Ti layer may be inserted between a $Cu_xTe$ stack (M2) and $Al_2O_3$ electrolyte (I2). The thickness of the buffer layer should be such that indiffusion of cations from M2 in I2 is possible. A 6 nm Ti layer for example completely suppresses the indiffusion processes, resulting in degraded CBRAM functionality. A 3 nm Ti layer allowed however controlled Cu injection into the $Al_2O_3$ electrolyte, resulting in excellent switching and thermal stability of the CBRAM device.

When a second voltage, having a polarity opposite the first voltage difference of the SET step, is applied over the two metal layers, the metallic filament dissolves. This metallic filament dissolution process of the RESET step allows switching the electrical resistance of the memory cell to higher values thereby bringing the memory cell in the OFF state. Hence, a reversible return to a higher electrical resistance state is obtained.

The formation and dissolution of the metallic filament is based on a redox reaction whereby a metal layer provides a metal cation which migrates through an insulator layer to a metal layer opposite to and positively biased with respect to the metal layer providing the metal cation. As shown in FIG. 1, a bipolar operation of the memory cell could be obtained whereby a hysteris effect is obtained around 0V such that each metal layer is to be biased with positive or negative voltages during operation of the memory cell.

Figure 2:
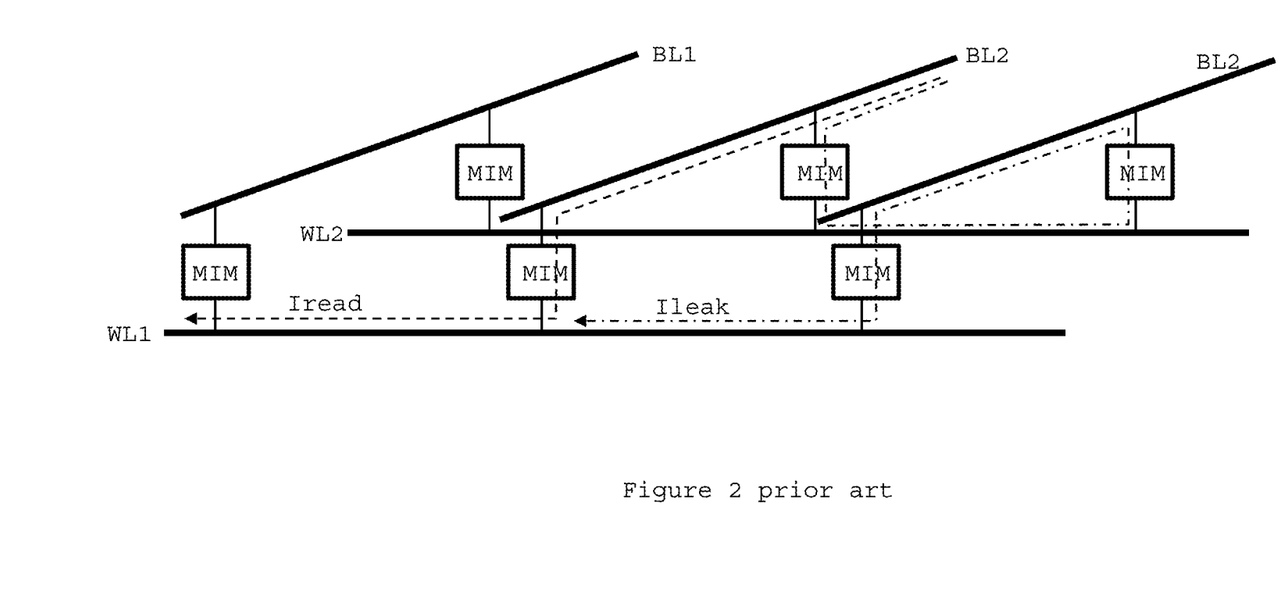
FIG. 2 illustrates the configuration of prior art CBRAM memory cells in a cross-bar array of 3 bit lines and 2 word lines. The dashed and dash-dotted lines refer to the current paths of the read out current and potential leakage current respectively in the absence of a selector element.

In an memory array, the memory cells are typically positioned at the cross-over between word lines and bit lines, thereby forming a programmable electrical path between a word line (WL) in one plane and a bit line (BL) in another plane, thereby constituting a memory bit. Such a memory array is known as a cross-point or cross-bar configuration as illustrated in FIG. 2 showing a cross-bar configuration of 3 bit lines and 2 word lines. The integration of RRAM MIM cells in such a cross-bar array is attractive because the size of the memory cell can be decreased to $F \times F$ nm$^2$, whereby F is the minimum lithographic defined feature size obtainable in a given semiconductor manufacturing technology. A particular memory cell can be addressed during operation by applying the appropriate voltages to the word line and bit line connected by this memory cell.

However, such a cross-bar array configuration may result in leakage current paths (Ileak) through other memory cells which are not selected but which have the word and/or bit line of the addressed memory cell in common. As these unselected memory cells may to some extent also be biased by this word and/or bit line during the operation of the selected memory cell, these unselected memory cells may be programmed. The leakage currents (Ileak) flowing through these unselected memory cells may add to the read-out current (Iread) of the addressed memory cell thereby resulting in a false reading of the resistance state of the selected memory cells as illustrated in FIG. 2. Here, the memory cell at the cross-over between word line WL1 and bit line BL2 is selected for read-out. However a leakage current path may be created through other memory cells (MIM) as indicated by the dash-dotted line.

To eliminate or reduce these leakage currents, a selector element may be placed in series with each memory cell between the word line and bit line connected to that memory element. During operation of the memory array, the selector element of the selected memory cell is biased to only allow current flow of the selected memory cell and/or the selector elements of the non-selected memory cells are biased to inhibit the current flow through these unselected memory cells. Such a selector element can be a bipolar or unipolar diode element. Adding such a selector element in series may add to process complexity or could limit the size scaling of the memory device even if the memory cell itself is scaled. Depending on the selector element only an unipolar operation of the memory device can be obtained However, today there is no selector technology complying with the constraints of the RRAM operation in terms of I-V non-linearity and/or asymmetry thereby allowing aggressive scaling of the memory cell even down to minimum feature sizes F below 20 nm. It would therefore be highly desired that the RRAM memory cell itself contains intrinsically the functionality of inhibiting leakage currents when not being selected. In this case the memory cell is a self-isolated memory cell thereby showing a strong I-V non-linearity as essentially no current flow is allowed when low voltage is applied over the memory cell. By using a MIM stack (CBRAM memory device) according to embodiments of the present disclosure, the MIM may function as both the memory element and as the selector element. This will now be explained in more detail.

As discussed above, during the SET step, metal cations (M2+) move through the insulating layer (I) separating the two metal layers (M1, M2) towards the cathode (M1) where these cations start agglomerating thereby forming the metallic filament (F). The metallic filament is only allowed to have a length $I_F$ less than the thickness of the insulating layer stack (I): $I_F < t_I$ or $I_F \sim t_{I1}$. A thin layer of insulator (I1) remains which acts as a tunnel barrier for electrons during operation of the memory cell. Such an electron tunnel barrier has a strong current voltage (I-V) non-linearity. At lower voltage bias, essentially no electrons can tunnel through this insulating barrier (I1) between the cation source metal layer (M2) and the metallic filament (F). Hence, no leakage current can flow through the memory cell. At higher voltages electrons can tunnel through this barrier (I1) thereby allowing the read-out of the memory cell. The distance over which the electrons tunnel may vary with voltage, as for higher voltage the length of the metallic filament may be modified and hence the spacing towards the thin insulator (I1) thereby resulting in an even stronger non-linear current-voltage characteristics. Hence, the electron tunnel barrier properties of the memory cell can be controlled by the thickness ($t_{I2}$) of the insulator layer (I2) adjacent to the source of metal cations (M2) and optionally by the energy barrier of this insulator layer (I2). The length ($I_F$) of the metallic filament (F) is substantially equal to the thickness ($t_{I1}$) of the insulator layer (I1) adjacent to the metal layer (M1) opposite the metal layer being the cation source (M2). The thicknesses and physical characteristics of the insulator layer (I) should allow improving the control over and tune of the switching voltages.

One possible way of impeding the growth of the filament (F) from the positive biased metal layer or cathode (M1) onwards is to mechanically impede the further growth or volume expansion of this metallic filament. The part (I1) of the insulator stack (I) adjacent to the metal layer (M1) where the metallic filament will start to form is selected to accommodate the volume expansion of this metallic filament, while the part of the (I2) of the insulator stack (I) adjacent to the metal layer (M2) providing the metal cations (M2+) is selected to limit or even inhibit this volume expansion.

When the filament formation is operated at reasonably low cation current, partial filament growth may be controlled through the properties of the insulator (I). In this situation, part of the insulator (I) is used for writing, i.e., forming, the metallic filament while the other part of the insulator (I) is used as a highly non-linear isolation element, e.g., a tunnel diode showing strongly non-linear I-V characteristics.

In some embodiments, the insulator stack (I) at least comprises adjacent to the metal cation source layer (M2) an insulator layer (I2) which is formed of a lower porous and/or higher density material, and adjacent to the metal cation agglomeration layer (M1) an insulation layer (I1) formed of a higher porous and/or lower density material. This transition in material properties of the insulator layer (I) can be more abrupt in case two different layers (I1, I2) are used as illustrated in FIG. 3 or can be more gradually.

The functionality of inhibiting the further growth of the metallic filament can be achieved when using layers (I2) of dense or void-free insulator materials. The denser the insulator material, the thinner this insulator layer (I2) can be thereby offering a balance between good tunneling properties and still being capable of impeding the further growth of the metallic filament.

Examples of such denser materials are thermal $SiO_2$, $HfO_2$ formed by atomic layer deposition (ALD) having a thickness of few nanometers, typically between 1 to 20 nm. For these materials the measured density of these thin layers, as obtained by X-ray reflectometry, showed a layer density comparable to the density of the bulk material. In such a situation, the filament growth from the cathode is impeded mechanically and thus limited.

The diffusion properties of the metal cations through the insulator layer may be taken into account. A threshold value for diffusivity D0, characterizing the diffusion of the metal cations through the insulator, is about 5e-6 cm$^2$/s, below which the insulating material qualifies for a layer of second insulator I2 and above which it qualifies for a layer of first insulator I1. For example the diffusion parameters for Cu in $Al_2O_3$ are D0=1e-5 cm$^2$/s, and Ea=0.9 eV.

The insulator layer (I) may comprise a layer of a second insulator (I2) adjacent to the second metal layer (M2) providing the metal cations (M2+) and a layer of an first insulator (I1) adjacent to the first metal layer (M1) whereby the layer density of the second insulator (I2) is higher than the layer density of the first insulator (I1). The layer density of the second insulator (I2) could be 85% or higher of the bulk density of that second insulator. Further, the layer density of the first insulator (I1) could be less than 85% of the bulk density of that first insulator. The layer density of the insulators (I, I1, I2) is expressed with reference to the bulk density of these insulators. The latter property is believed to correspond to the most closely packed and hence most dense form of the insulator. The closer the layer density is to the bulk density the more likely that layer will impede the volume expansion of the metallic filament during growth. Typically, the bulk density is extracted from high-temperature crystalline phases, e.g., sapphire for $Al_2O_3$. The layer and bulk density of an insulator can be obtained by using X-ray reflectometry (XRR), optionally combined with Rutherford Backscattering (RBS) or ellipsometry. Also mass measurement can be used for insulator layers above 50 nm by measuring the weight of a carrier before and after the insulator layer is formed.

According to embodiments a threshold value for diffusivity D0, characterizing the diffusion of the metal cations through the insulator, is about 5e-6 cm$^2$/s, below which the insulating material qualifies for a layer of second insulator I2 and above which it qualifies for a layer of first insulator I1. For example, for Cu in $Al_2O_3$ thin layers, ab-initio modelling has allowed estimating the diffusion parameters D0=1e-5 cm$^2$/s and Ea=0.9 eV Some experimental results are discussed below. A MIM stack of a $Cu_{0.6}Te_{0.4}$ metal layer (M2), an insulator layer, e.g., an ALD deposited a-$Al_2O_3$ electrolyte or thermal $SiO_2$ (I), and a bottom electrode/electrolyte (M1) is disclosed. A Pt top electrode is formed on the CuTe layer, while the second metal layer is used as bottom electrode.

Figure 4A:
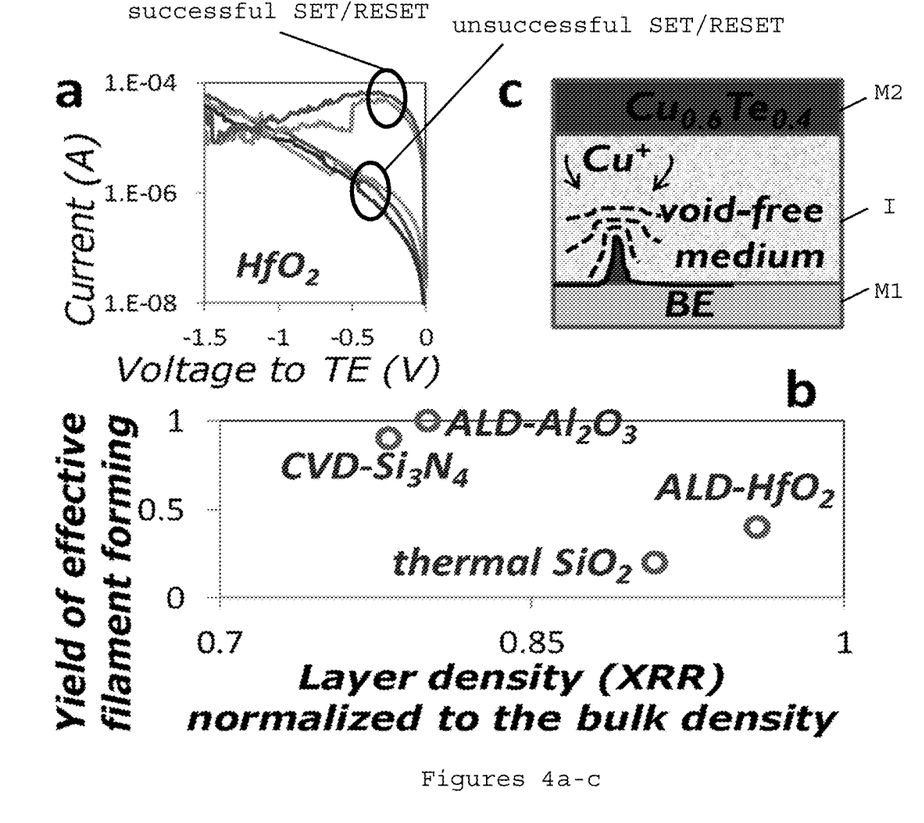

In FIG. 4(a) current-voltage characteristics of this MIM stack after metallic filament formation in the $HfO_2$ insulator (I) are shown. A set of virgin samples was subjected to a SET/RESET cycle. For some samples a complete metallic filament was created as shown by the higher current at lower voltages and a decrease of this current with increasing voltage being indicative of a RESET process. The corresponding I-V curves are labeled 'successful SET/RESET'. However for other samples, no or an incomplete metallic filament was formed during the SET process as shown by the low current for low voltages. The increase of the current with increasing voltage only reflects the characteristics of the insulator (I) showing that no RESET process is taken place. The corresponding I-V curves are labeled 'unsuccessful SET/RESET'. For the set of samples shown in FIG. 4a, two out of five samples were successful corresponding to a yield of less than 50%.

FIG. 4(b) shows the relationship between effective metallic filament formation and the density of the insulator in which these metallic filaments are to be formed, using the statistical approach as illustrated in FIG. 4(a). The denser the insulator material, the less and more incomplete metallic filaments are formed. The normalized layer density of the insulator is used as a metric for the porosity of the insulator and the extent to which volume expansion of the metallic filament can be accommodated as discussed before.

FIG. 4(c) schematically illustrates this impeded metallic filament growth in a substantially void-free medium, where it is believed that the mechanical stress, indicated by the solid lines, created by the growing metallic filament can be not accounted for the void-free medium and hence the filament growth is impeded.

By optimizing various characteristics, such as density, thickness, etc., of the insulator (I, I1, I2), the growth of the metallic filament may be controlled. In some embodiments, the control over the metallic filament formation can be improved if the insulator layer (I) is engineered as a double-layer stack (I1, I2) with one (I1) of the two layers being of a lower density, e.g., amorphous $Al_2O_3$, allowing easy metallic filament growth, while the other one (I2) of the two layers being of a higher density, e.g., thermal $SiO_2$, preventing metallic filament growth. Self-isolated CBRAM properties are observed in the MIM stack when using thermal $SiO_2$ as the insulator inhibiting further metallic filament growth.

Figure 5:
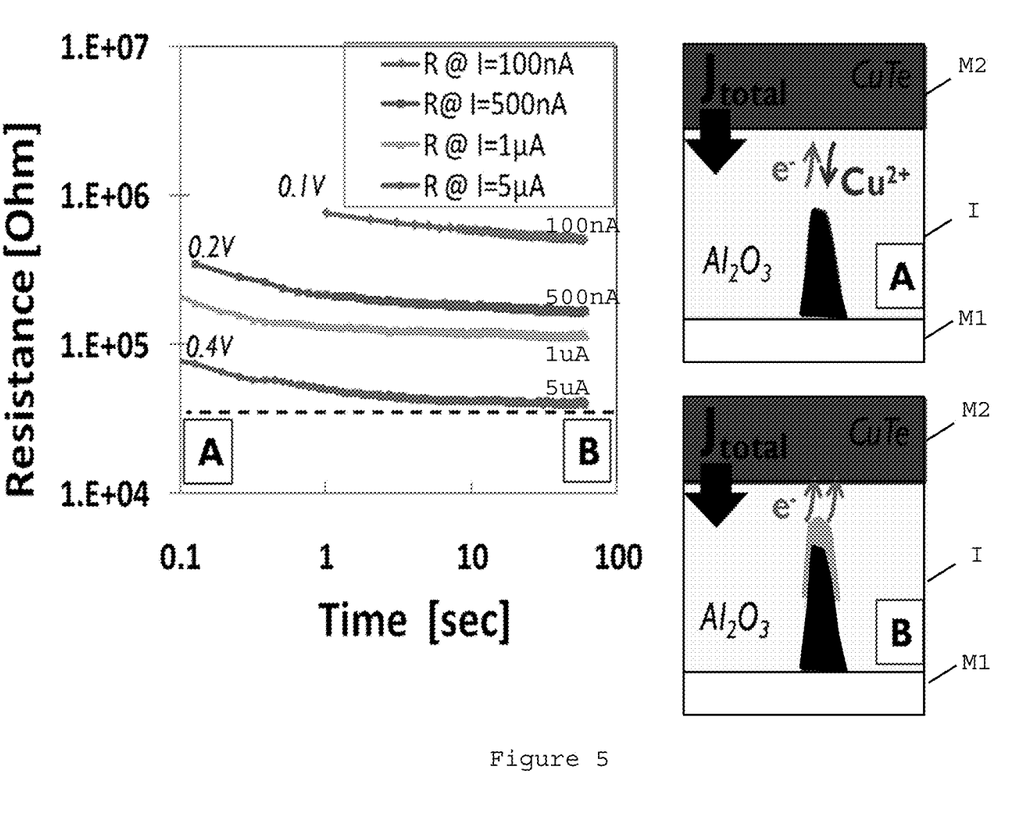
FIG. 5 illustrates the saturating effect resulting from an incomplete filament growth for a CBRAM memory cell according to certain embodiments of this disclosure.

Controlling the metallic filament growth requires control of the current during formation thereof. When growing the metallic filament (F), the distance δ between the tip of the filament (F) and the cation source (M2) decreases thereby resulting in an increase of contribution the electronic current over the ionic contribution in the overall filament forming current. When the forming current is set at predetermined level, from a given distance $δ_f$ the forming current will be entirely taken over by the electronic current thereby stopping the ionic flow of Cu cations and thus stopping the filament growth. As shown in FIG. 5, initially (A) the metallic filament forming current has an electron component (e−) and an ion component (Cu2+). With time (B), the tip of the metallic filament will approach the Cu-containing layer (M2) and the electron component will dominate the forming current. By selecting the current and voltage level one can determine the speed at which the resistance drops, the latter being proportional to the speed at which the metallic filament is formed. The lower the voltage applied over the memory cell, the slower the resistance drops with time and the more control one has over the filament forming process.

Figure 6:
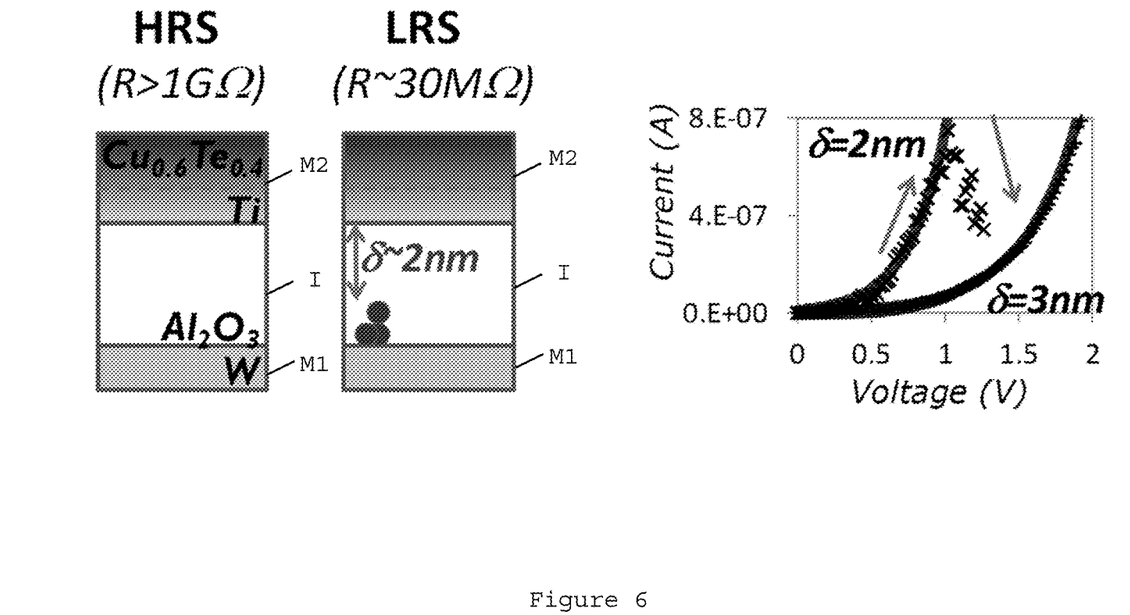
FIG. 6 illustrates the programming of a high-resistance metallic filament by partial filament growth through an $Al_2O_3$ insulator resulting in strong current-voltage characteristics for a CBRAM memory cell according to certain embodiments of this disclosure.

This self-limiting mechanism allows partial filament growth through the insulator and in principle should be observed irrespective of the insulator. This is the reason why very high filament resistances may be programmed even with less dense $Al_2O_3$ insulator layer (I) as shown in FIG. 6. In this case a strong I-V non-linearity is observed also in the low resistance state (LRS). Such characteristics requires cell operation at relatively low current (<1 uA).

The control of the partial or incomplete metallic filament growth can be improved when current control during formation, as discussed in the previous paragraph, is combined with the selecting the volume expansion inhibiting characteristics of the insulator (I) as discussed above. In real memories, the program time is short. In the onset of this program cycle, the cation current will sharply increase while the voltage over the memory cell remains essentially constant dependent on the time constant of the memory cell circuitry. Hence, the filament will grow even faster thereby reducing the control over the length of the metallic filament. Consequently, controlling the speed at which the metallic filament grows only by voltage, as discussed in the previous paragraph might be very difficult. However, if a denser layer (I2) would be present, its presence would strengthen the control of the partial metallic filament growth by limiting the growth during the transient switching. Furthermore, such a dense layer (I2) helps in stabilizing the length of the partially formed metallic filament even at higher voltages.

Figure 7:
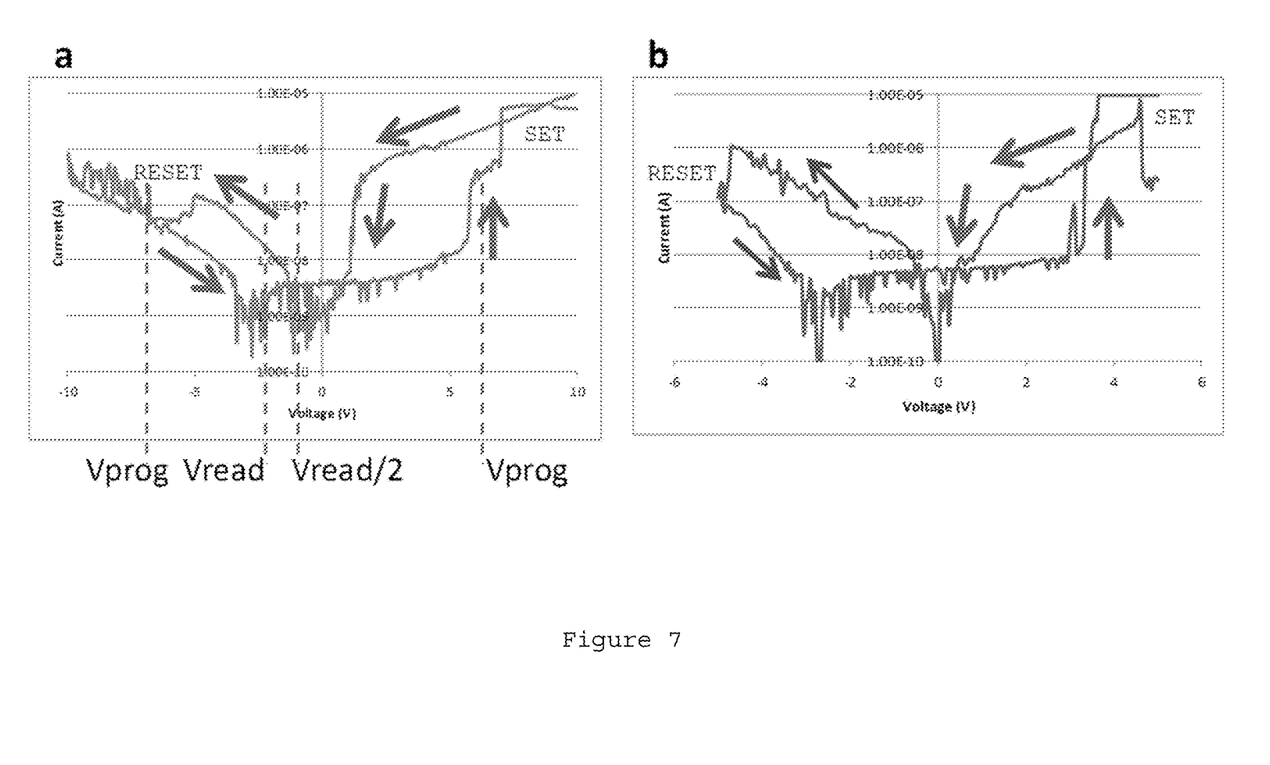
FIGS. 7a-b shows current-voltage characteristics for different insulator stacks for CBRAM memory cells according to certain embodiments of this disclosure.

FIG. 7 shows current-voltage characteristics obtained using either (a) a single insulator layer (I) formed of thermal $SiO_2$ (a), or (b) a double insulator stack (I1, I2) formed of a bilayer of $Al_2O_3/SiO_2$. Strong I-V non-linearity is obtained for Si\SiO-thermal(10 nm)\Ti(3 nm)\Cu60Te40(50 nm)\Pt (50 nm) stack of FIG. 7a. Comparable self-isolated CBRAM properties can be obtained when using the Si\AlO(3 nm)SiO-snow (10 nm)\Ti(3 nm)\Cu60Te40(50 nm)\Pt (50 nm) stack of FIG. 7b. The 3 nm of AlO allows easy filament growth while the 10 nm of $SiO_2$ will prevent filament growth.

Figure 8:
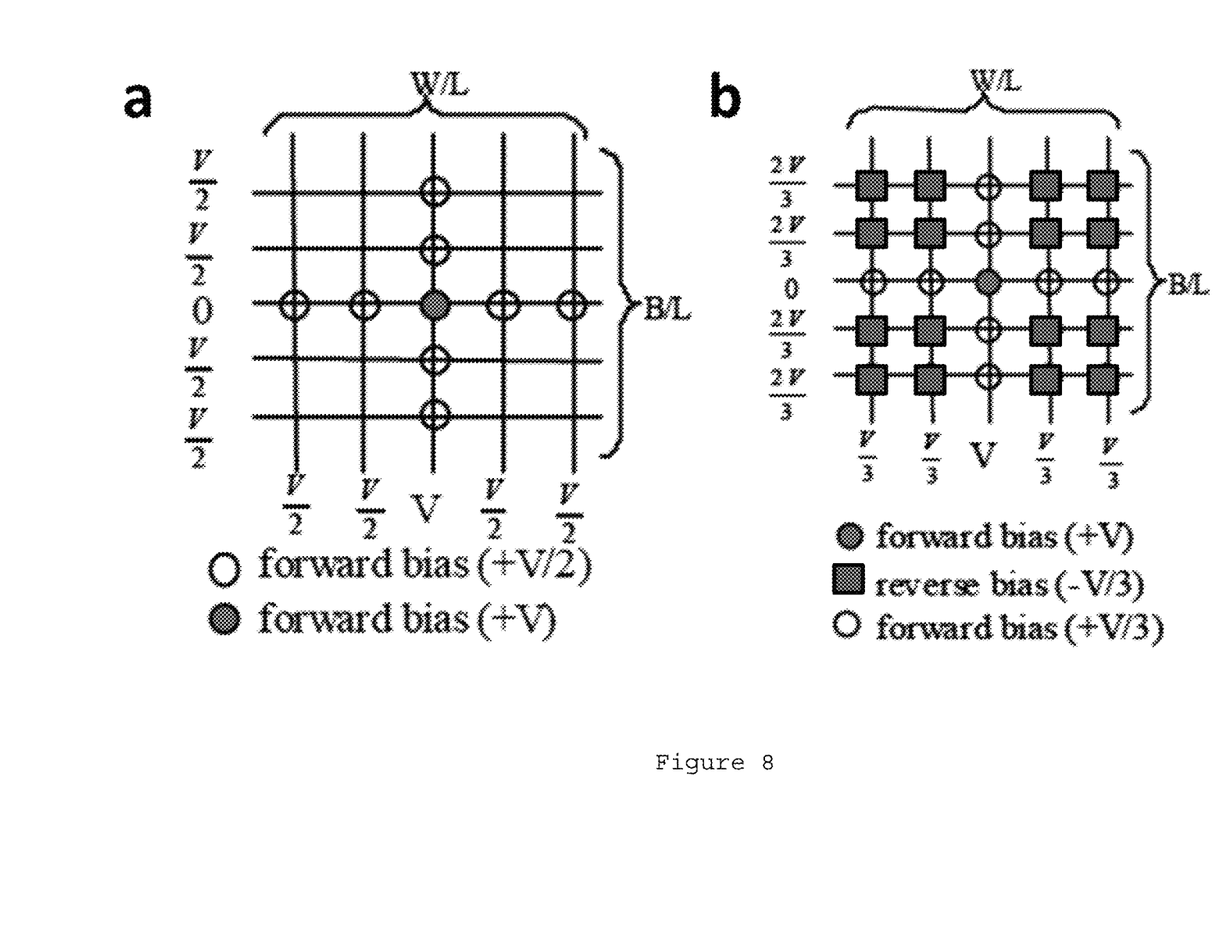
FIGS. 8a-b illustrates biasing schemes for addressing CBRAM memory cells in a cross-bar array for CBRAM memory cells according to certain embodiments of this disclosure.

Appropriate memory array program and read schemes prevent parasitic programming of unselected cells and false reading can be applied thereby exploiting the non-linear current-voltage characteristics of CBRAM memory cells, according to disclosure, arranged in a cross-bar configuration. FIGS. 8a and 8b show examples of such biasing schemes to address an individual memory cell in such a cross-bar configuration. FIG. 8a illustrates the ½ method whereby none of the unselected memory cells (open circles) is subjected to more than 50% of the bias voltage Vbias applied to the selected memory cell (solid circle). FIG. 8b illustrates the ⅓ method whereby none of the unselected memory cells (open circles, solid squares) is subjected to more than 33% of the bias voltage Vbias applied to the selected memory cell (solid circle). If the memory cell is configured as discussed above to show a strong current voltage non-linearity between Vbias and Vbias/2 or Vbias/3, the contribution of leakage currents from unselected cells is substantially reduced. In FIG. 7a, the voltage window for the reading and programming such a memory cell is disclosed. Between Vread and Vread/2 a non-linear current-voltage characteristics is present.

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

The invention claimed is:

1. A conductive-bridge random access memory device comprising:
    a second metal layer configured to provide second metal cations;
    a layer of insulator adjacent to the second metal layer, the layer of insulator comprising a layer of first insulator and a layer of second insulator, the layer of second insulator being adjacent to the second metal layer; and
    a first metal layer adjacent to the layer of first insulator, the first metal layer being opposite to the second metal layer,
    wherein a crystalline structure density of the layer of second insulator is higher than a crystalline structure density of the layer of first insulator, such that the layer of insulator forms an integral selector element in which metallic filament growth speed is lower in the layer of second insulator than in the layer of first insulator.

2. The conductive-bridge random access memory device according to claim 1, wherein the layer of first insulator and the layer of second insulator consist of a same insulating material.

3. The conductive-bridge random access memory device according to claim 1, further comprising a buffer layer in between the second metal and the layer of second insulator.

4. The conductive-bridge random access memory device according to claim 1, wherein layer density of the layer of second insulator is 85% or more of bulk density of the layer of second insulator and layer density of the layer of first insulator is less than 85% of bulk density of the layer of first insulator.

5. The conductive-bridge random access memory device according to claim 1, wherein the layer of insulator has a thickness tI, the layer of first insulator has a thickness tI1 and the layer of second insulator has a thickness tI2, wherein the thickness of the layer of second insulator tI2 is between 1 and 20 nm.

6. The conductive-bridge random access memory device according to claim 5, wherein the thickness of the layer of first insulator tI1 is substantially equal to a length of metallic filament during filament growth.

7. The conductive-bridge random access memory device according to claim 1, wherein the layer of second insulator is a thermally grown silicon-oxide.

8. A method of manufacturing a CBRAM memory cell comprising:
    forming a first metal layer;
    forming a layer of first insulator on the first metal layer;
    forming a layer of second insulator on the layer of first insulator; and
    forming a second metal on the layer of second insulator,
    and wherein a crystalline structure density of the layer of second insulator is higher than a crystalline structure density of the layer of first insulator, such that the layer of first insulator and the layer of second insulator form an integral selector element in which metallic filament growth speed is lower in the layer of second insulator than in the layer of first insulator.

9. The method of manufacturing a CBRAM memory cell according to claim 8, wherein layer density of the layer of second insulator is 85% or more of bulk density of the layer of second insulator and layer density of the layer of first insulator is less than 85% of bulk density of the layer of first insulator.

10. The conductive-bridge random access memory device according to claim 1, wherein a diffusivity of the layer of second insulator is higher than a diffusivity of the layer of first insulator.

11. The conductive-bridge random access memory device according to claim 1, wherein a diffusivity of the layer of second insulator is lower than 5e-6 cm$^2$/s, and a diffusivity of the layer of first insulator is higher than 5e-6 cm$^2$/s.

12. The method of claim 8, wherein a diffusivity of the layer of second insulator is higher than a diffusivity of the layer of first insulator.

13. The method of claim 8, wherein a diffusivity of the layer of second insulator is lower than 5e-6 cm$^2$/s, and a diffusivity of the layer of first insulator is higher than 5e-6 cm$^2$/s.

14. A conductive-bridge random access memory device comprising:
   a second metal layer configured to provide second metal cations;
   a layer of insulator adjacent to the second metal layer, the layer of insulator comprising a layer of first insulator and a layer of second insulator, the layer of second insulator being adjacent to the second metal layer; and
   a first metal layer adjacent to the layer of first insulator, the first metal layer being opposite to the second metal layer,
   wherein a diffusivity of the layer of second insulator is higher than a diffusivity of the layer of first insulator, such that the layer of insulator forms an integral selector element in which metallic filament growth speed is lower in the layer of second insulator than in the layer of first insulator.

15. The conductive-bridge random access memory device according to claim 14, wherein the diffusivity of the layer of second insulator is lower than 5e-6 cm$^2$/s, and the diffusivity of the layer of first insulator is higher than 5e-6 cm$^2$/s.

16. The conductive-bridge random access memory device according to claim 14, wherein a porosity of the layer of second insulator is lower than a porosity of the layer of first insulator.

17. The conductive-bridge random access memory device according to claim 1, wherein the layer of first insulator and the layer of second insulator are different insulating materials.

18. The method of according to claim 8, wherein the layer of first insulator and the layer of second insulator are different insulating materials.

19. The conductive-bridge random access memory device according to claim 14, wherein the layer of first insulator and the layer of second insulator are different insulating materials.

* * * * *